US008983088B2

(12) United States Patent
Conrad

(10) Patent No.: US 8,983,088 B2
(45) Date of Patent: Mar. 17, 2015

(54) SET OF INTERACTIVE COASTERS

(76) Inventor: Jeffrey B. Conrad, Arlington Heights, IL (US)

( * ) Notice: Subject to any disclaimer, the term of this patent is extended or adjusted under 35 U.S.C. 154(b) by 470 days.

(21) Appl. No.: 13/410,642

(22) Filed: Mar. 2, 2012

(65) Prior Publication Data

US 2012/0250876 A1 Oct. 4, 2012

Related U.S. Application Data

(60) Provisional application No. 61/469,958, filed on Mar. 31, 2011.

(51) Int. Cl.

| | |
|---|---|
| ***H04B 3/00*** | (2006.01) |
| ***H03G 3/00*** | (2006.01) |
| ***G10H 1/36*** | (2006.01) |
| ***A63H 5/00*** | (2006.01) |
| ***H04B 7/24*** | (2006.01) |
| ***H04R 5/02*** | (2006.01) |

(52) U.S. Cl.
CPC .................................... *H04R 5/023* (2013.01)
USPC .................. 381/81; 381/80; 381/61; 84/610; 446/397; 455/39

(58) Field of Classification Search
USPC ........ 381/61, 77, 79, 80, 81, 62; 84/609, 600, 84/610; 446/397, 491; 455/39, 41.2, 41.3, 455/66.1
See application file for complete search history.

(56) References Cited

U.S. PATENT DOCUMENTS

| | | | | |
|---|---|---|---|---|
| 4,336,574 | A | 6/1982 | Goodman | |
| 5,784,265 | A | 7/1998 | Chen | |
| 6,110,000 | A * | 8/2000 | Ting | 446/302 |
| 6,354,711 | B1 | 3/2002 | McCoy | |
| 6,641,454 | B2 * | 11/2003 | Fong et al. | 446/297 |
| 7,063,432 | B2 | 6/2006 | VanderSchuit | |
| 7,331,194 | B2 | 2/2008 | Lefkowitz et al. | |
| 8,444,452 | B2 * | 5/2013 | Dang et al. | 446/397 |
| 2004/0123722 | A1 * | 7/2004 | Cohen | 84/410 |
| 2007/0256547 | A1 | 11/2007 | Feeney et al. | |
| 2008/0026672 | A1 | 1/2008 | Hardin | |

FOREIGN PATENT DOCUMENTS

| | | | |
|---|---|---|---|
| GB | 2369036 | A | 5/2002 |
| JP | 10225362 | A | 8/1998 |

* cited by examiner

*Primary Examiner* — Vivian Chin
*Assistant Examiner* — David Ton
(74) *Attorney, Agent, or Firm* — Eugene M. Cummings, P.C.; David Lesht

(57) ABSTRACT

The present disclosure is directed to a set of interactive coasters. Specifically, it is an object of the present disclosure to provide a set of musically interacting coasters which harmonize when placed in proximity to one another.

6 Claims, 4 Drawing Sheets

SET OF INTERACTIVE COASTERS

CROSS-REFERENCE TO RELATED APPLICATIONS

The present patent application is a non-provisional application claiming the benefit under 35 U.S.C. §119(e) of U.S. Provisional Application Ser. No. 61/469,958 filed on Mar. 31, 2011, and entitled "SET OF INTERACTIVE COASTERS," naming Jeffrey B. Conrad as inventor, the complete disclosure thereof being incorporated herein by reference.

BACKGROUND OF DISCLOSURE

The present disclosure is directed to a set of interactive coasters. Coasters are well known in the prior art and generally consist of small pieces of wood, plastic, or other material people put between a surface, such as a table, and a beverage container. Generally, coasters are used to protect the surface from the heat, scratching, moisture or the like. However, coasters may also be decorative in nature. Coasters have been made in a variety of colors and materials.

SUMMARY OF DISCLOSURE

The present disclosure is directed to a set of interactive coasters. Specifically, it is an object of the present disclosure to provide a set of musically interacting coasters which harmonize when placed in proximity to one another.

DETAILED DESCRIPTION OF THE DRAWINGS

Embodiments of the present disclosure relate to a set of musically interactive coasters that harmonize when placed in proximity to one another. The following description is presented to enable one of ordinary skill in the art to make and use the present disclosure and is provided in the context of a patent application and its requirements. Various modifications to the preferred embodiment and the generic principles and features described herein will be readily apparent to those skilled in the art. Thus, the present disclosure is not intended to be limited to the embodiments shown, but is to be accorded the widest scope consistent with the principles and features described herein. Embodiments of the present disclosure will now be described in detail with references to the accompanying drawings.

Figure 1:
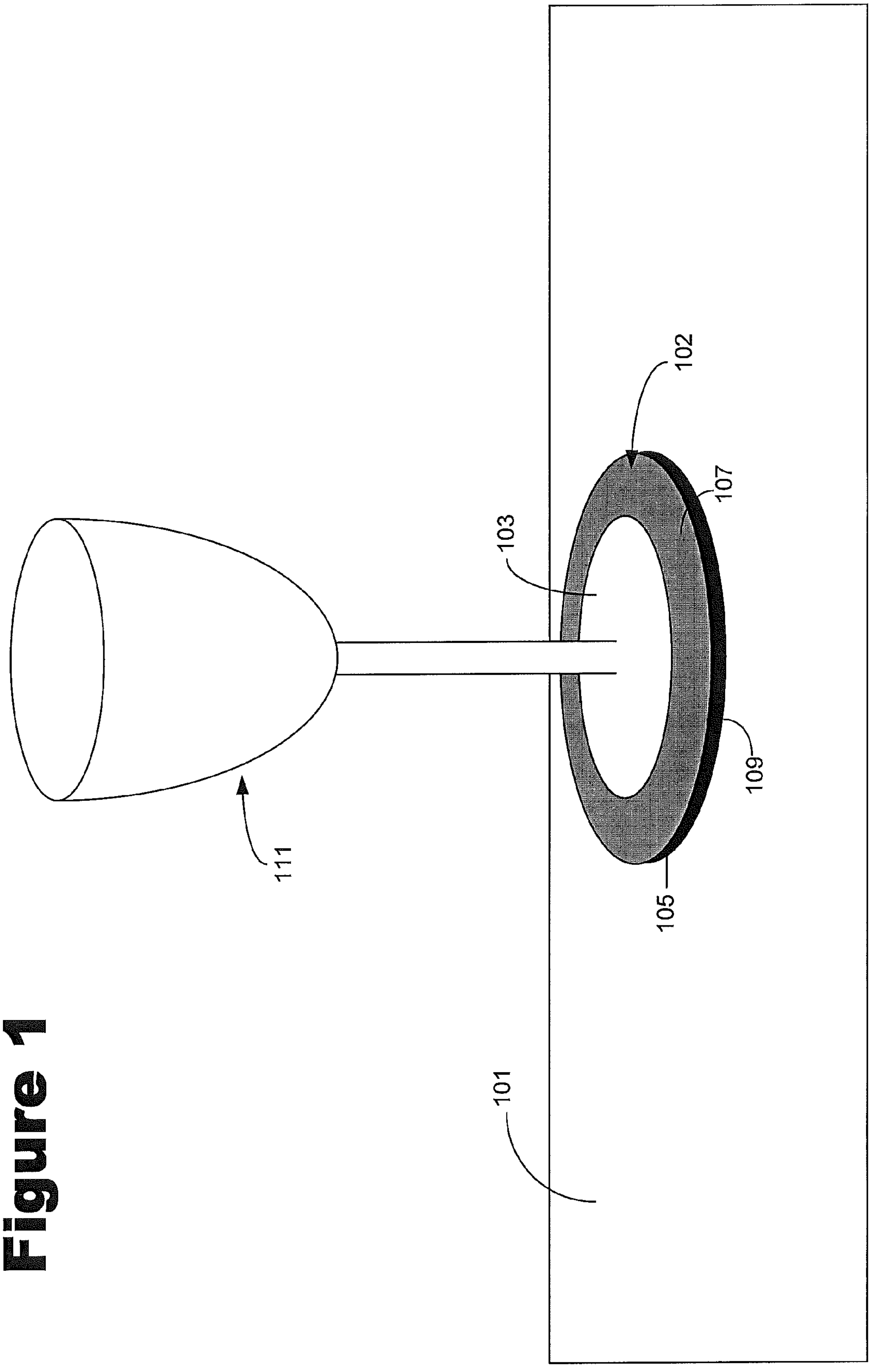
FIG. 1 illustrates a perspective view of an individual coaster situated between a table and a beverage container.

The present application discloses a set of musically interactive coasters that harmonize when placed in proximity to one another. The set of musically interactive coasters is comprised of a plurality of at least two individual coasters. As illustrated in FIG. 1, each individual coaster 102 is generally comprised of a body portion 105, a top support surface 107 and a bottom base surface 109. Each coaster 102 may provide a support surface for the foot or bottom surface 103 of a drinking vessel or beverage container 111. During use, the coaster 102 is generally situated between the bottom surface 103 of a beverage container 111 and the top surface of a substrate 101, such as a table or bar counter, to protect the substrate 101 from heat, scratching, moisture or the like. It will be appreciated that the bottom base surface 109 of coaster 102 is generally configured to provide a stable engagement with substrate 101, and that the upper top surface 107 of coaster 102 is configured to provide a stable engagement with the foot or bottom surface 103 of a drinking vessel or beverage container 111. While coaster 102 is shown as having a circular shape, it may be in any shape or form so long as it provides stable upper and lower engagement surfaces. For example, the bottom base surface 109 and the upper top surface 107 of coaster 102 may include a flat surface, a series of concentric rings/ridges or other geometric configurations which presents a substantially planar engagement surface.

Figure 2:
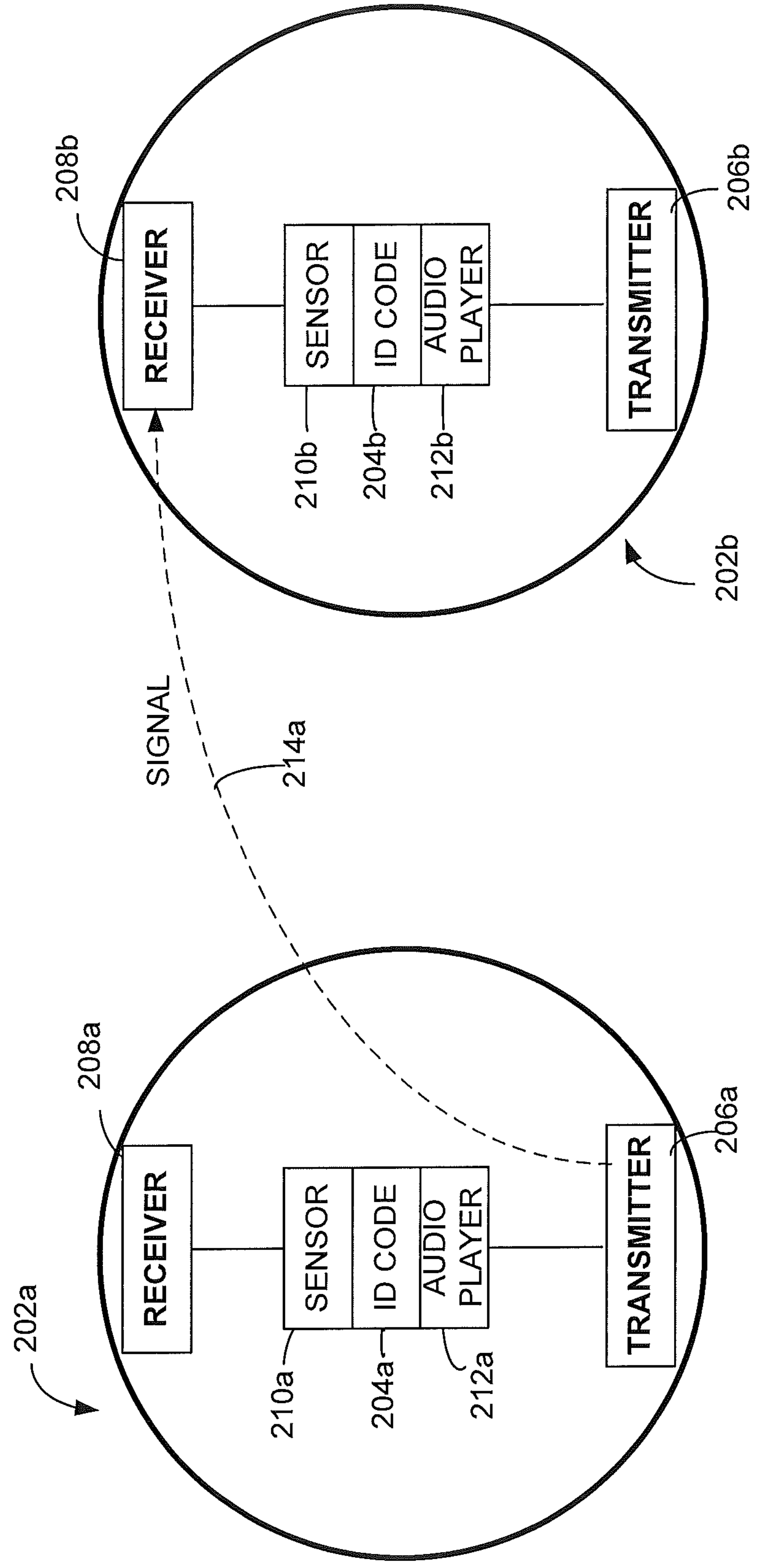
FIG. 2 illustrates a plan cross-sectional view of an embodiment of the set of musically interactive coasters of the present disclosure.

Preferably, each individual coaster in the musically interactive coaster set has the capability to interact musically with at least one other coaster of the set. FIG. 2 illustrates an embodiment of a musically interactive set of coasters being comprised of two coasters **202*a* and 202*b*. Coaster 202*a* and coaster 202*b*** are each pre-programmed with a tune or portions of a tune which, when played together in sequence, comprise harmony and melody. The pre-programmed tune may be embedded in a standard miniature audio device, also known as an audio player and/or audio player-recorder. Such standard miniature audio devices are well known and used, for example, in musical greeting cards.

In this embodiment, the standard audio devices in each coaster **202*a*, 202*b*** include: a memory component for storing one or more tunes, a speaker, and a circuit board for connecting the speaker to the memory component to allow playback. The circuit board is also connected to a power supply and a switch for activation thereof. In another embodiment (not shown), each individual coaster may include a more elaborate known miniature audio device, such as an MP3 player (e.g. iPod®, iShuffle®, etc.). It will also be appreciated that the miniature audio device may be equipped with a microphone and/or a recording mechanism and appropriate circuitry, as readily known, understood, and appreciated by one of ordinary skill in the art, to enable customized programming. Thus, for example, one or more individuals may record their own voices and/or their own songs on the coaster audio device, and/or load their own preferred recording and have a customized interactive vocal coater set.

As discussed above, each individual coaster has the capability to interact musically with at least one other coaster included in the set. In the embodiment of FIG. 2, the first coaster **202*a* includes a first identification code 204*a*, a first wireless communication interface (such as radio frequency signal transmitter 206*a* and receiver 208*a*), a first sensor 210*a*, and a first audio player 212*a*. Correspondingly, the second coaster 202*b* includes a second identification code 204*b*, a second wireless communication interface 206*b*, 208*b*, a second sensor 210*b*, and a second audio player 212*b*. The first and second coaster 202*a*, 202*b* each further include a power supply source. For example, each coaster 202*a*, 202*b*** may be powered by a small, flat battery situated in a cavity defined therein (not shown).

Each coaster has three modes of operation: 1) active mode; 2) standby mode; and 3) off mode. In active mode, power is supplied to the coaster via the battery. The coaster **202*a*, 202*b* is activated by an external stimulus (i.e., manual on/off switch, presence of moisture, temperature change, the weighted pressure of the beverage container or audible external stimuli) (not shown), which signals to the coaster 202***a*, 202*b* to emit a musical tune via the audio player 212*a*, 212*b*. It will be appreciated that a manual on/off activation switch could be placed on the side of the coaster body and that a pressure sensitive switch or other activation switches could be readily built into the body of the coaster by one of ordinary skill in the art. In standby mode, the power is supplied to the coaster 202*a*, 202*b* via the battery, but no music is emitted because no signal has been received. In off mode, no power is being supplied thereto and no signal may be received.

In the embodiment of FIG. 2, when the first coaster 202*a* is activated by an external stimulus, it emits the preprogrammed musical tune via the first audio player 212*a*. The second coaster 202*b* is situated in close proximity to the first coaster 202*a* in standby mode. When the first coaster 202*a* emits the musical tune, it simultaneously sends a radio frequency signal 214*a* via the first wireless communication interface 206*a*, 208*a* to the second coaster 202*b*. The second coaster 202*b* receives the signal 214*a* via the second wireless communication interface receiver 206*b*. The signal 214*a* acts as an external stimulus to activate the second coaster 202*b*, thereby causing it to begin to emit its preprogrammed musical tune. The sensor 210*b* of the second coaster 202*b* senses the audible stimuli emitted by the first coaster 202*a* and adjusts the second coaster's 202*b* tune accordingly so that the first coaster 202*a* and the second coaster 202*b* are in harmony.

Alternatively, the first coaster 202*a* and second coaster 202*b* may be configured to participate in an interaction sequence in which: the first coaster wirelessly communicates using the first wireless communication interface, the second coaster wirelessly communicates using the second wireless communication interface, a musical composition is selected based on both the first identification code and the second identification code, and the first coaster and the second coaster cooperatively play the musical composition, with each of the first coaster and the second coaster playing a different part of the musical composition.

In another embodiment (not shown), the first coaster has a stored first library of musical segments according to a first musical style, a first wireless communication interface and a first audio player, and a second coaster has a stored second library of musical segments according to a second musical style, a second wireless communication interface and a second audio player. The first coaster and the second coaster are configured to participate in an interaction sequence in which: the first coaster wirelessly communicates using the first wireless communication interface and the second coaster wirelessly communicates using the second wireless communication interface, a musical composition is selected based on the first musical style, the first coaster plays the musical composition, and the second coaster plays accompanying music being based on the second musical style and either or both of (1) the first musical style and (2) the musical composition that the first coaster is playing.

Figure 3:
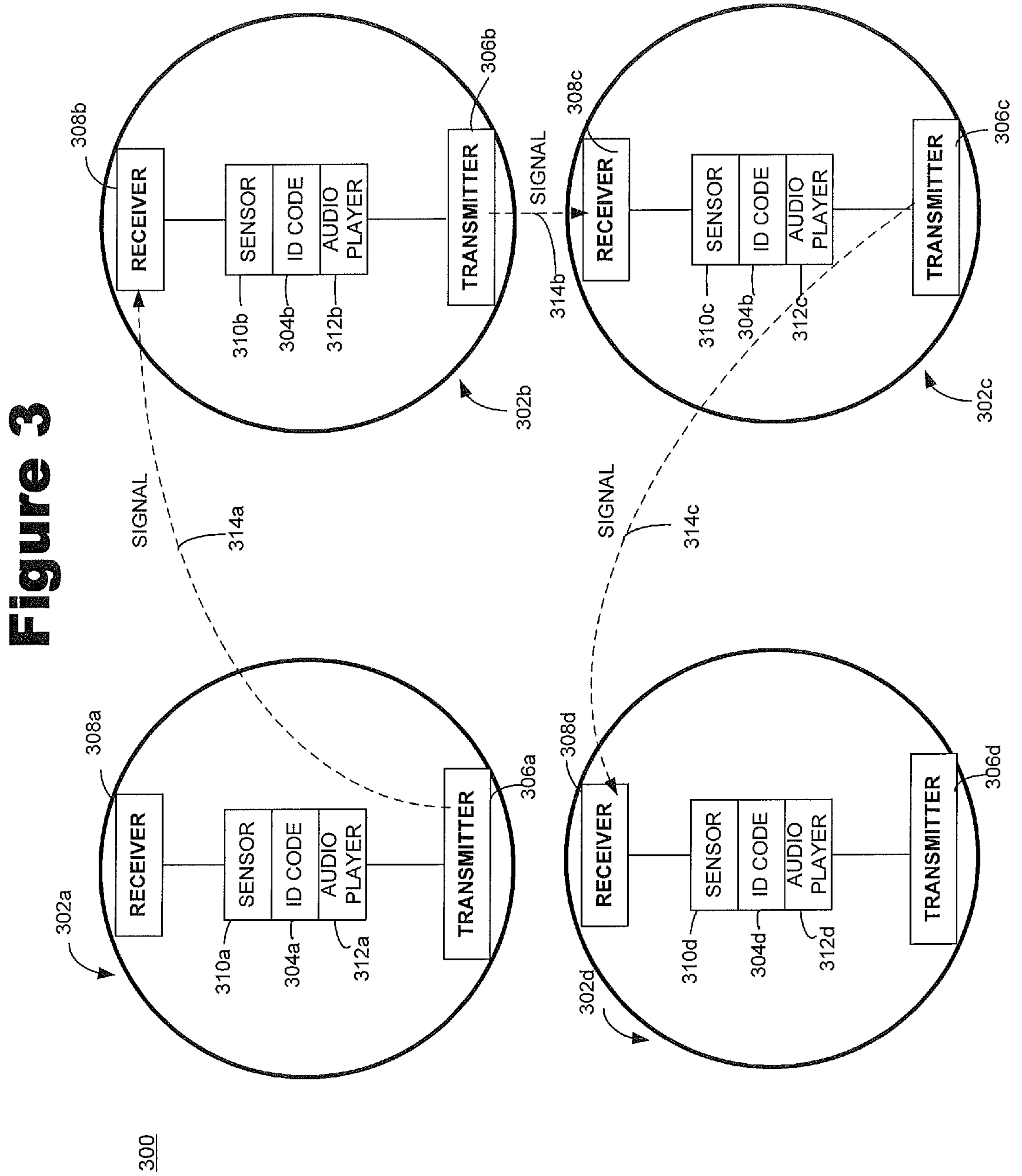
FIG. 3 illustrates a plan cross-sectional view of an embodiment of the set of musically interactive coasters of the present disclosure.

In yet another embodiment shown in FIG. 3, a set of musically interactive coasters 300 is provided including at least four coasters 302*a-d*. In this embodiment, each coaster 302*a-d* is sequentially radio frequency sensitive. That is, when a first coaster 302*a* of a four coaster set 300 begins to output music via its audio player 312*a*, the second coaster 302*b* is activated by its sensor 310*b* sensing such music. The second coaster 302*b* then begins to output music, accordingly, via its audio player 312*b*. A delay factor may be built or programmed into the sensor 310*b*, e.g. the second coaster 302*b* may be set to output music with a 5 second delay. The third coaster 302*c* is then activated by sensing via sensor 310*c* the music emitted by the second coaster 310*b*. The third coaster 310*c* then begins to output music via its audio player 312*c*, which the fourth coaster 302*d* senses via sensor 310*d*, triggering it to output music via its audio player 312*d*, resulting in all four coasters 302*a-d* operating with musical output in harmony at the same time.

Figure 4:
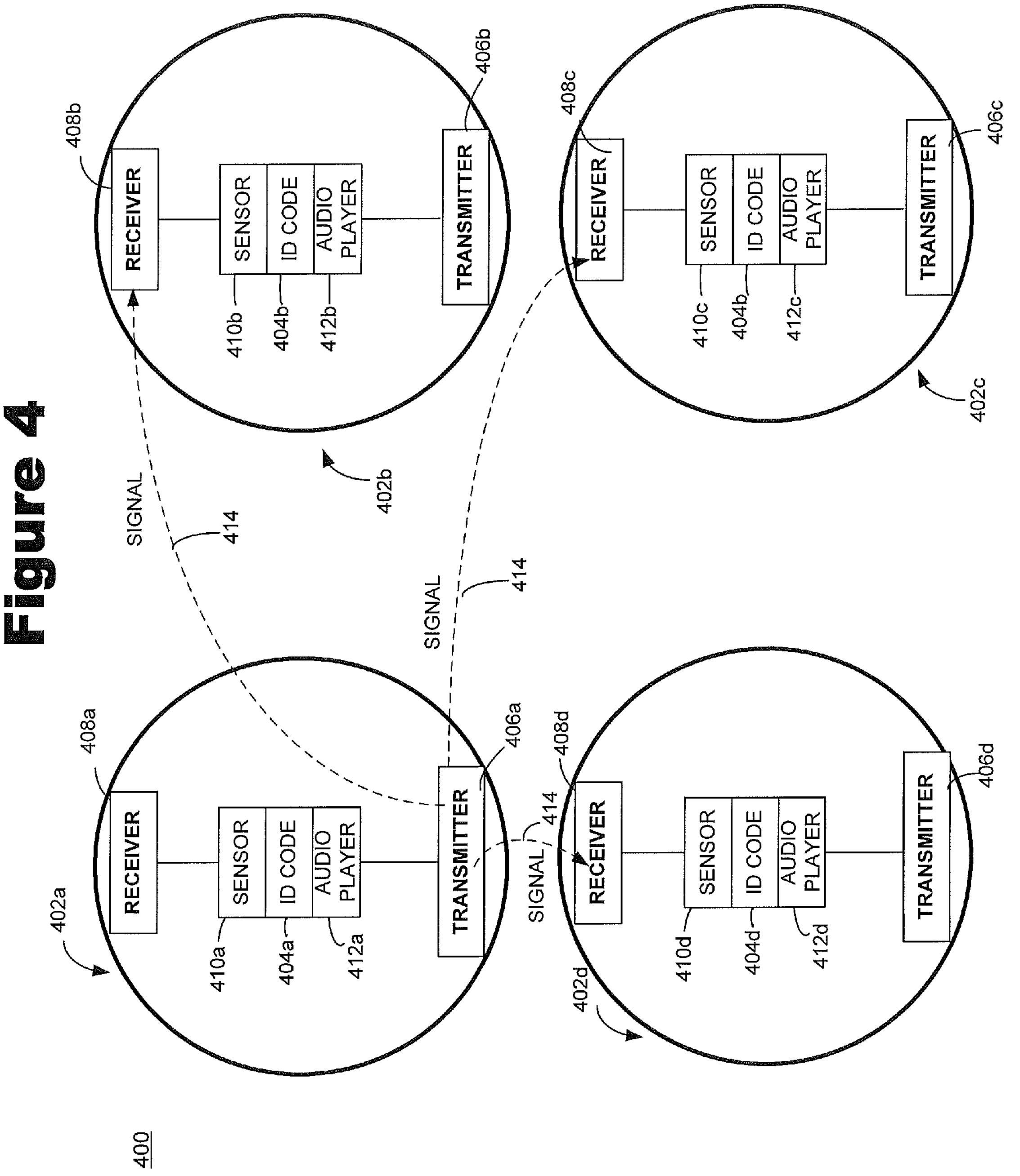
FIG. 4 illustrates a plan cross-sectional view of an embodiment of the set of musically interactive coasters of the present disclosure.

In another embodiment, illustrated in FIG. 4, a set of musically interactive coasters 400 is provided including at least four coasters 402*a-d*. In this embodiment, when the first coaster 402*a* emits the musical tune, it simultaneously sends a radio frequency signal 414 via the first wireless communication interface transmitter 406*a* to the second coaster 402*b*, the third coaster 402*c* and the fourth coaster 402*d*. The second, third and fourth coasters 402*b-d* receive the signal 414 via their respective receivers 406*b*, 406*c*, and 406*d*. The signal 414 acts as an external stimulus to activate the second, third and fourth coasters 402*b-d*, thereby causing them to begin to emit their preprogrammed musical tunes. The sensors 410*b-d* of the second, third and fourth coasters 402*b-d* senses the audible stimuli emitted by the first coaster 402*a* and adjusts the second, third and fourth coaster's 402*b-d* tunes accordingly so that all coasters 402*a-d* in the set 400 are in harmony.

The present sets of musically interactive coasters have been described in accordance with the embodiments shown, and one of ordinary skill in the art will readily recognize that there could be variations to the embodiments, and any variations would be within the spirit and scope of the present disclosure. Accordingly, many modifications may be made by one of ordinary skill in the art without departing from the spirit and scope of the appended claims.

The invention claimed is:

1. A set of musically interactive coasters for protecting a substrate from engagement with a beverage container, comprising:

a first coaster comprising a body portion, a top support surface and a bottom base surface, said first coaster having a power supply and an activation mechanism, said first coaster further including a first audio player comprising a first memory component for storing a first preprogrammed sound having a first identification code associated therewith, a first speaker for emitting said first preprogrammed sound, and a first circuit for connecting said first speaker to said first memory component, said first coaster further including a first sensor and a first wireless communication interface including a first receiver and a first transmitter for emitting a signal including said first identification code;

a second coaster comprising a body portion, a top support surface and a bottom base surface, said second coaster having a power supply and an activation mechanism, said second coaster further including a second audio player comprising a second memory component for storing a second preprogrammed sound having a second identification code associated therewith, a second speaker for emitting said second preprogrammed sound, and a second circuit for connecting said second speaker to said second memory component, said second coaster further including a second sensor and a second wireless communication interface including a second receiver and a second transmitter for emitting a signal including said second identification code; and whereby said first coaster and said second coaster are configured to interact such that when said first speaker emits a preprogrammed sound identified by said first identification code and emits a signal including the first identification code via the first wireless communication interface first transmitter, said second coaster receives said first identification code via said second wireless communication interface second receiver and said second coaster emits said second preprogrammed sound via said second speaker, whereby the sound from the first coaster and the sound from the second coaster are played in musical harmony with one another, and wherein the second sensor senses the audible stimuli emitted by the first speaker and adjusts the second preprogrammed sound to be in musical harmony with the first preprogrammed sound.

2. The set of musically interactive coasters of claim 1, wherein the first coaster and the second coaster are further configured to participate in an interaction sequence in which the first coaster communicates with the second coaster via the first wireless communication interface and the second wireless communication interface to select a preprogrammed sound based on both the first identification code and the second identification code such that the first coaster emits one part of the preprogrammed sound and the second coaster emits another part of the preprogrammed sound.

3. The set of musically interactive coasters of claim 1, wherein the first coaster further includes a stored first library of musical segments according to a first musical style and the second coaster further includes a stored second library of musical segments according to a second musical style.

4. The set of musically interactive coasters of claim 3, wherein the first coaster and the second coaster are configured to participate in an interactions sequence in which the first coaster and the second coaster wireless communicate via the first communication interface and the second communication interface to select a musical composition based on the first musical style, to cause the first coaster to emit the musical composition via the speaker, and to cause the second coaster to emit accompanying music based on the second musical style.

5. The set of musically interactive coasters of claim 1, further including a third coaster and a fourth coaster.

6. A set of musically interactive coasters for protecting a substrate from engagement with a beverage container, comprising:

a first coaster comprising a body portion, a top support surface and a bottom base surface, said first coaster having a power supply and an activation mechanism, said first coaster further including a first audio player comprising a first memory component for storing a first preprogrammed sound having a first identification code associated therewith, a first speaker for emitting said first preprogrammed sound, and a first circuit for connecting said first speaker to said first memory component, said first coaster further including a first sensor and a first wireless communication interface including a first receiver and a first transmitter for emitting a signal including said first identification code;

a second coaster comprising a body portion, a top support surface and a bottom base surface, said second coaster having a power supply and an activation mechanism, said second coaster further including a second audio player comprising a second memory component for storing a second preprogrammed sound having a second identification code associated therewith, a second speaker for emitting said second preprogrammed sound, and a second circuit for connecting said second speaker to said second memory component, said second coaster further including a second sensor and a second wireless communication interface including a second receiver and a second transmitter for emitting a signal including said second identification code;

whereby said first coaster and said second coaster are configured to interact such that when said first speaker emits a preprogrammed sound identified by said first identification code and emits a signal including the first identification code via the first wireless communication interface first transmitter, said second coaster receives said first identification code via said second wireless communication interface second receiver and said second coaster emits said second preprogrammed sound via said second speaker, whereby the sound from the first coaster and the sound from the second coaster are played in musical harmony with one another;

wherein the first coaster further includes a stored first library of musical segments according to a first musical style and the second coaster further includes a stored second library of musical segments according to a second musical style, and wherein the first coaster and the second coaster are configured to participate in an interactions sequence in which the first coaster and the second coaster wireless communicate via the first communication interface and the second communication interface to select a musical composition based on the first musical style, to cause the first coaster to emit the musical composition via the speaker, and to cause the second coaster to emit accompanying music based on the second musical style.

* * * * *